(12) United States Patent
Behrendt et al.

(10) Patent No.: US 12,136,585 B2
(45) Date of Patent: Nov. 5, 2024

(54) COMPACT POWER ELECTRONICS MODULE WITH INCREASED COOLING SURFACE

(71) Applicant: Danfoss Silicon Power GmbH, Flensburg (DE)

(72) Inventors: Stefan Behrendt, Kiel (DE); Ronald Eisele, Surendorf (DE)

(73) Assignee: DANFOSS SILICON POWER GMBH, Flensburg (DE)

( * ) Notice: Subject to any disclaimer, the term of this patent is extended or adjusted under 35 U.S.C. 154(b) by 420 days.

(21) Appl. No.: 17/607,942

(22) PCT Filed: Apr. 30, 2020

(86) PCT No.: PCT/EP2020/062036
§ 371 (c)(1),
(2) Date: Nov. 1, 2021

(87) PCT Pub. No.: WO2020/221862
PCT Pub. Date: Nov. 5, 2020

(65) Prior Publication Data
US 2022/0293489 A1    Sep. 15, 2022

(30) Foreign Application Priority Data

May 2, 2019   (DE) .......................... 102019111366.0

(51) Int. Cl.
*H01L 23/473*   (2006.01)
(52) U.S. Cl.
CPC .................. *H01L 23/473* (2013.01)
(58) Field of Classification Search
CPC ........ H01L 23/473; H01L 2224/48227; H05K 3/0061
See application file for complete search history.

(56) References Cited

U.S. PATENT DOCUMENTS

| 4,069,497 A | 1/1978 | Steidlitz |
| 6,757,171 B2 | 6/2004 | Bauer et al. |

(Continued)

FOREIGN PATENT DOCUMENTS

| CN | 101305460 A | 11/2008 |
| CN | 106340493 A | 1/2017 |

(Continued)

OTHER PUBLICATIONS

International Search Report for PCT/EP2020/062038 Dated Aug. 6, 2020.

(Continued)

*Primary Examiner* — Samuel A Gebremariam
(74) *Attorney, Agent, or Firm* — McCormick, Paulding & Huber PLLC

(57) ABSTRACT

The invention relates to a power electronics module including a first circuit carrier (5,10, 11), as well as an electronic assembly (20, 30) arranged in an electrically contacting manner on the upper flat side of the first circuit carrier (5, 10, 11), and a first cooling element (40) in thermal contact with the underside of the first circuit carrier (5, 10, 11), wherein the module has at least one second assembly (20, 30) arranged on the upper side of a second circuit carrier (5, 10, 11) and a second cooling element (40) arranged on the underside of the second circuit carrier (5, 10, 11), wherein the first and the second circuit carriers (5, 10, 11) are arranged with their upper sides facing one another and at least one central heat sink (60, 61, 63, 64) that is electrically insulated from the assemblies (20, 30) is arranged in the space between the assemblies (20, 30), wherein the assemblies (20, 30) and the at least one central heat sink (60, 61, 63, 64) are embedded in a heat-conducting potting compound (50), wherein the module has a number N≥3 of circuit carriers (5, 10, 11) with assemblies (20, 30) mounted on their (Continued)

upper sides and cooling elements (40) mounted on their undersides, and the sides having the assemblies (20, 30) and directed towards one another are arranged around the central heat sink (60, 61, 63, 64) forming a shape with an N-sided polygon as across-section.

20 Claims, 2 Drawing Sheets

(56) References Cited

U.S. PATENT DOCUMENTS

| | | | |
|---|---|---|---|
| 10,832,995 | B2 | 11/2020 | Eisele et al. |
| 11,400,514 | B2 | 8/2022 | Osterwald et al. |
| 2003/0067754 | A1 | 4/2003 | Bauer et al. |
| 2004/0089931 | A1 | 5/2004 | Nakajima et al. |
| 2007/0268671 | A1 | 11/2007 | Brandenburg et al. |
| 2010/0038758 | A1 | 2/2010 | Stolze |
| 2011/0304991 | A1 | 12/2011 | Huang et al. |
| 2016/0157384 | A1 * | 6/2016 | Liu .................. H05K 7/14329 361/709 |
| 2016/0260648 | A1 | 9/2016 | Eisele |
| 2016/0352244 | A1 | 12/2016 | Cheng et al. |
| 2017/0365541 | A1 | 12/2017 | Eisele et al. |

FOREIGN PATENT DOCUMENTS

| | | |
|---|---|---|
| DE | 1514413 A1 | 6/1969 |
| DE | 602005000529 T2 | 11/2007 |
| DE | 10 2014 201 032 A1 | 7/2015 |
| DE | 10 2015 103 096 A1 | 9/2015 |
| DE | 102015221062 A1 | 5/2017 |
| DE | 102016212289 A1 | 1/2018 |
| DE | 102017119368 A1 | 3/2018 |
| DE | 102009002191 A1 | 10/2018 |
| EP | 1 858 077 A2 | 11/2007 |
| EP | 3066684 B1 | 10/2014 |
| GB | 1095387 A | 12/1967 |
| JP | 2006-313768 A | 11/2006 |

OTHER PUBLICATIONS

International Search Report for PCT/EP2020/062036 Dated Jul. 30, 2020.

* cited by examiner

COMPACT POWER ELECTRONICS MODULE WITH INCREASED COOLING SURFACE

CROSS-REFERENCE TO RELATED APPLICATION

This application is a National Stage application of International Patent Application No. PCT/EP2020/062036, filed on Apr. 30, 2020, which claims priority to German Application No. 102019111366.0 filed on May 2, 2019, each of which is hereby incorporated by reference in its entirety.

TECHNICAL FIELD

The invention relates to a power electronics module having a circuit carrier, as well as an electronic assembly arranged in an electrically contacting manner on the upper flat side of the circuit carrier, and a cooling element thermally contacted with the underside of the circuit carrier, i.e., thermally conductively connected to the underside of the circuit carrier.

BACKGROUND

Power electronics assemblies comprise an assembly carrier, for example a circuit board, which is pre-structured for electrical connection and which is populated with components designed for high currents. The assembly embodies parts of a power electronics module which conduct current during operation. The assembly is thus a heat source as a result of the ohmic power loss.

Other parts of the module are used, inter alia, to transport away the generated heat via a contact face to a heat sink, wherein the primary heat sink is usually an air- or water-cooled cooling element. At high currents and alongside inadequate cooling, there is a risk that the assembly will be destroyed.

Conventional circuit carriers are, for example, copper leadframes or organically or ceramically insulated printed circuit boards or assembly carriers, which have a conductive track structure. The components are electrically connected to the conductive tracks of the circuit carrier by pressed or materially connected contact elements, for example bonding wires or strips. Circuit carriers are either designed themselves to be heat-spreading, for example by a thick metallic layer on the underside, which is electrically insulated from the current-conducting conductors of the upper side by a dielectric coating, or they are designed ceramically with, typically thin, conductive tracks arranged on the upper side and are mounted on a separate metallic heat-spreading plate.

In the context of the present description, heat spreading always occurs on the underside of the circuit carrier, i.e., the circuit carrier can have an additionally mounted heat-spreading plate or can also itself act in a heat-spreading manner. The underside of the circuit carrier is in thermal contact in a frictionally engaged and form-fitting manner with a primary heat sink. By contrast, the heat on the upper side of the circuit carrier is generated by ohmic losses in the assembly.

The assembly is usually embedded—or also potted—in an electrical insulation material, such as silicone gel or an electrically insulating epoxy resin, wherein the insulation material often has a thermal insulation of just as high a value. Only the external connection contacts of a power electronics module remain exposed.

The heat is transported away from the assembly to the cooling element over two timeframes: pulsed outputs (<1 second) and continuous outputs (>>1 second). Pulsed outputs are too short to directly reach the heat sink and must be temporarily absorbed in the thermal mass of the insulation material in the vicinity of the assembly. By contrast, continuous outputs lead to a continuous heat flow of the power loss by all thermally conductive materials to the heat sink along the thermal gradient.

To improve the cooling, potting compounds that are good thermal conductors and at the same time are electrically insulating have already been proposed as insulation materials, for example an inorganic cement in DE 1 514 413 A1. Document EP 3 066 684 B1 also uses a heat-conducting cement, in order to arrange on the surface thereof lying above an assembly on the populated side of the heat-spreading plate, a second cooling element in thermal contact (see in particular FIGS. 3 and 4 of EP 3 066 684 B1).

The thermally conductive cement is thoroughly well suited to absorb pulse outputs. However, its thermal conductivity lies in a range between 1 and 20 W/(m*K) and thus one or two orders of magnitude below the thermal conductivity value of a conventional cooling element. In continuous operation, in spite of the two-sided cooling of the assembly, the power module from EP 3 066 684 B1 is heated very asymmetrically, because the majority of the generated heat may be delivered predominantly to the cooling element on the underside of the heat-spreading plate. The second cooling element on the surface of the potting compound therefore for the most part fails to work effectively.

SUMMARY

The object of the present invention is therefore to provide the most compact possible power electronics module with improved cooling.

This object is achieved by the power electronics module having the features of claim 1. The dependent claims detail advantageous embodiments.

The basic idea of the invention can be considered that of proceeding from the power electronics modules that are nowadays producible as standard—initially without potting compound—and arranging, in particular in a fixed manner, a plurality of such modules with the flat sides carrying the assemblies—that is to say the heat sources—in a manner directed towards one another, so that they form a space between the assemblies. This space is thus heated by ohmic power losses of the assemblies particularly intensely and from a plurality of sides. For cooling, an additional central heat sink is therefore arranged inside the space in accordance with the invention, for example a metallic heat dissipator or a pipe through which cooling liquid is passed. The central heat sink may also comprise a plurality of heat dissipators, in particular also a combination of different heat dissipators, for example formed from solid bodies and pipes through which fluid is passed. The heat dissipators can be connected to one another so that the central heat sink is designed as an object, for example a grid or a pipe array. The central heat sink is fixed and permanently held in the space between the assemblies by filling the space with a heat-conducting potting compound, in particular an inorganic cement, which embeds the assemblies and the central heat sink jointly in an individual potting volume.

The power electronics module according to the invention is cooled in principle at its outer sides by cooling elements which are thermally contacted to the undersides of the circuit carrier during the course of a conventional manufacturing process. In addition, cooling by a central heat sink which is electrically insulated from the assemblies at least by the potting compound and in particular is held at fixed distances also exists within the module.

In accordance with the invention, a power electronics module having a first circuit carrier, as well as an electronic assembly arranged in an electrically contacting manner on the upper flat side of the first circuit carrier, and a first cooling element in thermal contact with the underside of the first circuit carrier, that is to say thermally attached to the underside of the first circuit carrier, is thus proposed, wherein the module has at least one second assembly arranged on the upper side of a second circuit carrier and a second cooling element arranged on the underside of the second circuit carrier, wherein the first and the second circuit carriers are arranged with their upper sides facing one another and at least one central heat sink that is electrically insulated from the assemblies is arranged in the space between the assemblies, wherein the assemblies and the at least one central heat sink are embedded in a heat-conducting potting compound, wherein the module has a number N≥3 of circuit carriers with assemblies mounted on their upper sides and cooling elements mounted on their undersides, and the sides having the assemblies and directed towards one another are arranged around the central heat sink forming a shape with an N-sided polygon as a cross-section.

Due to the embodiment according to the invention, multi-dimensional spatial arrangements are thus possible, wherein the polygonal cross-section can be closed off so to speak by covers on its upper side and underside, at least in part. It is self-evident here that it must be ensured that entry to and exit from the centrally arranged heat sink is maintained.

The central heat sink preferably has a shape with an N-sided polygon as cross-section, wherein the N-sided polygon of the heat sink and the N-sided polygon formed by the circuit carriers particularly preferably have an identical shape.

The first circuit carrier and/or the second circuit carrier are preferably planar.

In accordance with a further preferred embodiment, the first cooling element is in thermal contact (thermally conductively attached) in a frictionally engaged and/or form-fitting manner with (to) the underside of the first circuit carrier, wherein the second cooling element can also particularly preferably be thermally contacted in a frictionally engaged and/or form-fitting manner with the underside of the second circuit carrier.

The first and the second circuit carrier are particularly arranged in a fixed manner with upper sides facing one another.

In accordance with a particularly preferred embodiment, the circuit carriers are the same size.

Lastly, the circuit carriers are arranged fixed around the central heat sink.

BRIEF DESCRIPTION OF THE DRAWINGS

The module according to the invention can thus deviate significantly from the flat, almost two-dimensional design of previous conventional power modules as shown by the following figures.

DETAILED DESCRIPTION

Figure 1:
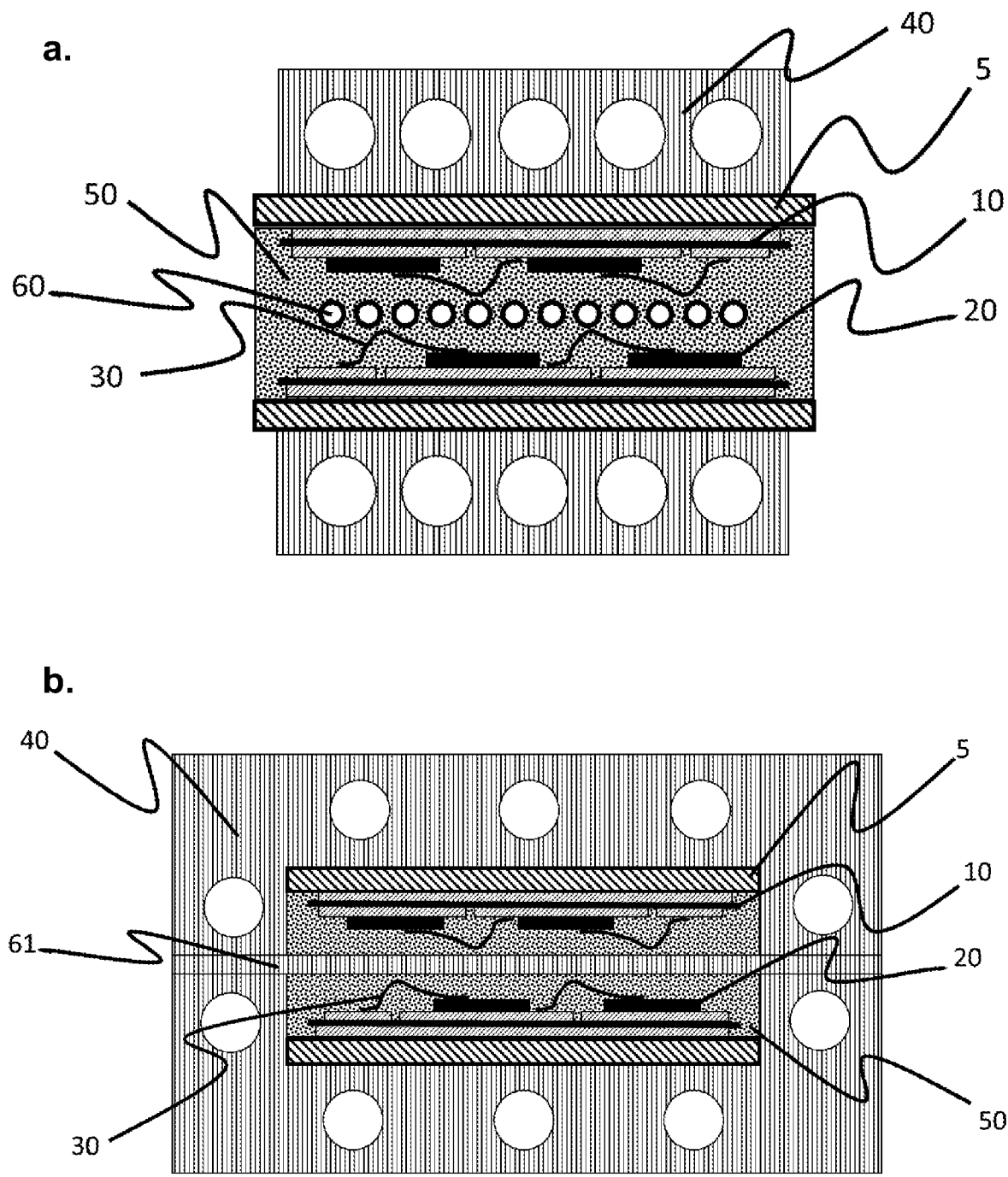
FIG. 1 shows (a) two single power switches in parallel symmetry with active liquid cooling inside as central heat sink and (b) two single power switched in parallel symmetry with passive internal cooling through a planar heat-conducting plate as central heat sink.

The invention will be explained in greater detail on the basis of the exemplary embodiments of particularly preferred design and shown in the figures.

FIG. 1a shows one of the simplest embodiments of a preferred design of a power electronics module. It is formed from two conventional power modules, the sides of which carrying the assemblies are arranged oppositely in a fixed manner, facing one another. A ceramic substrate 10 with conductive track elements, mounted on a heat-spreading plate 5 form, as circuit carriers 5, 10 with semiconductor components 20 mounted thereon contacted with bonding wires 30 form an individual switch 5, 10, 20, 30. The underside of the circuit carrier 5, 10 has a cooling element 40, which is mounted in thermal contact. A second, identical arrangement is arranged in parallel, but optionally rotated here through 180°, opposite the first arrangement. The necessary distance between both assemblies 20, 30 is given by the electrical insulation distance, which is necessary to maintain electrical safety. The space between the assemblies 20, 30 is filled with an electrically insulating, preferably inorganic potting compound 50 with high thermal conductivity. It is thus ensured that all heat-dissipating surfaces of the assemblies 20, 30 are in material contact with the potting compound 50. An additional cooler structure 60, for example pipes through which liquid is passed or closed heatpipes, forms the central heat sink within the potting compound 50. The heat sink 60 is held permanently in its position once the potting compound 50 has cured and thus also always remains potential-free.

FIG. 1b shows a variation of FIG. 1a, in which the cooling elements 40 extend beyond the edges of the heat-spreading plates 5 and beyond these edges are elevated to above the maximum height of the assemblies 20, 30. In other words, the cooling elements 40 in this exemplary embodiment have a trough-like form, and the assemblies 20, 30 are in each case arranged on the base of such a trough. If the trough-shaped cooling elements 40 are set in thermal contact with one another by means of their elevated edges, the interior with the assemblies 20, 30 is surrounded on four sides by heat sinks 40. FIG. 1 b) also shows a very good thermally conductive structure in the form of a metallic or ceramic heat-conducting bridge 61, for example a plate made of copper or aluminum or silicon-nitride ceramic or aluminum-nitride ceramic. The heat-conducting bridge 61 here forms the central heat sink 60 of the compact power electronics module instead of the heatpipes from FIG. 1a. The heat-conducting bridge 61 is mounted between the two outer cooling elements 40 and is in thermal contact therewith at the edges of the cooling elements 40. It can be formed from the same material as the cooling elements 40, in particular from a metal. The rest of the interior surrounded by the trough-shaped cooling elements 40 and not otherwise occupied is filled, preferably completely, with heat-conducting potting compound 50.

The thermal conductivity value of the potting compound is preferably greater than 3 W/*(mK). Known heat-conducting cements achieve values of more than 10 W/*(mK). The thermal conductivity value of the material of the heat-conducting bridge 61 is furthermore preferably at least 20 times greater than the thermal conductivity value of the potting compound.

FIG. 2a shows a compact power electronics module with a triangular cross-section. An insulated circuit carrier 11 which is itself designed in a heat-spreading manner and which has conductive track elements and semiconductors 20 mounted thereon contacted with bonding wires 30 form a half-bridge 11, 20, 30 here. The underside of the circuit carrier 11 has a cooling element 40 mounted in thermal contact. A second and a third identical module are mounted together with the first in an isosceles triangle arrangement. The distance between the three half-bridges 11, 20, 30 is thus minimal. The space between the three assemblies 20, 30 is filled with electrically insulating, preferably inorganic potting compound 50 with high thermal conductivity. It is thus ensured that all heat-dissipating surfaces of the assemblies 20, 30 are in material contact with the filling compound. An additional cooler structure 63, for example a heat-conducting rod or a pipe through which liquid is passed or a closed heatpipe, forms the central heat sink inside the potting compound 50.

The comparison of FIG. 2a with FIG. 2b shows the possibility of further optimisations: in particular the cooler structure 63 with round cross-section can be easily replaced by a cooler structure 64 with triangular cross-section. This has the direct advantage of shortening most thermal paths from the assemblies 20, 30 to the central heat sink 64 through the—comparatively poorly heat-conducting—potting compound 50. At the same time, this variation of the cross-section of the central heat sink 64 does not have a disadvantageous effect on the outer dimensions of the compact power electronics module according to the invention.

Figure 2:
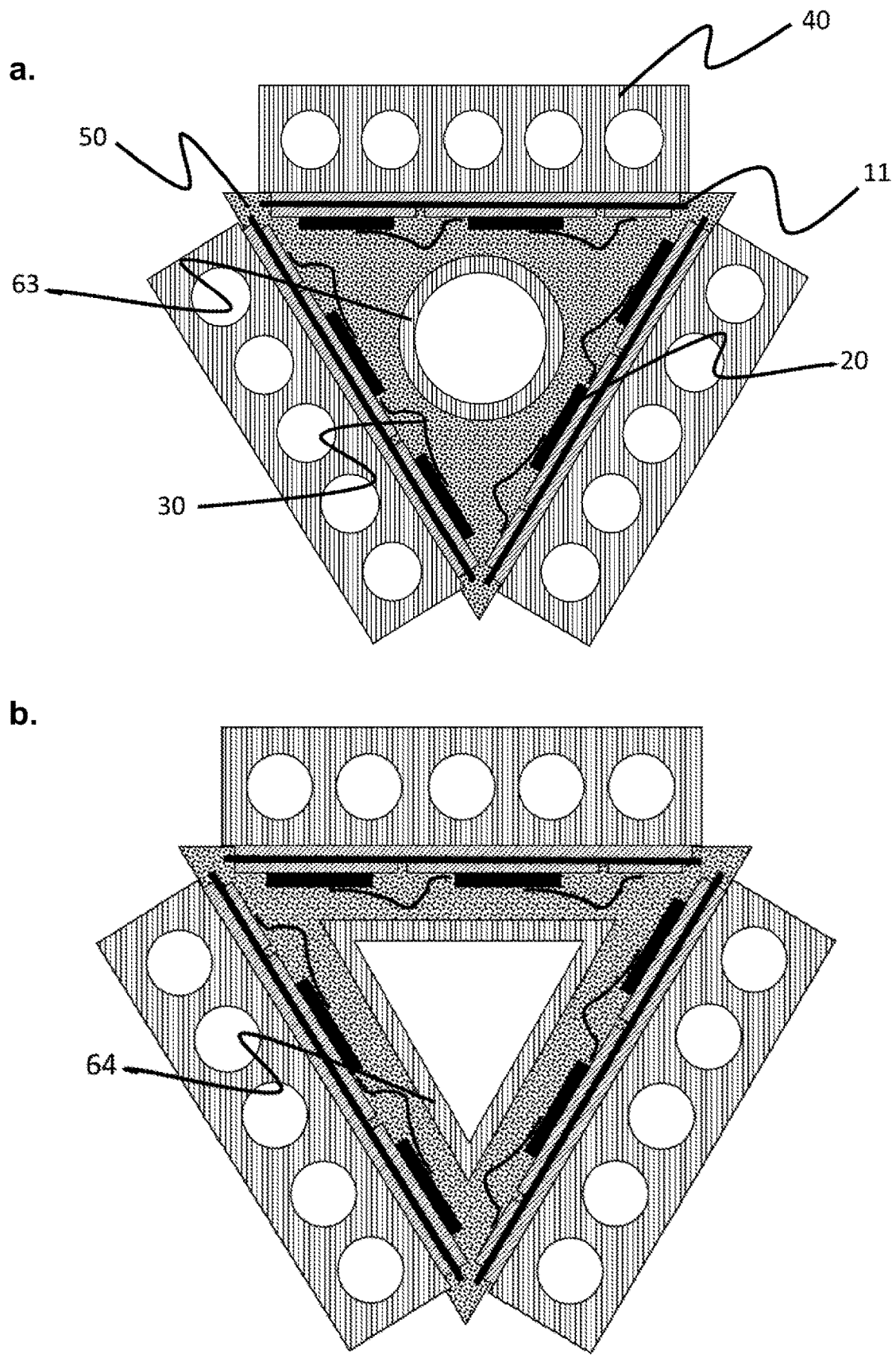
FIG. 2 shows (a) three power switches (here half-bridges) in triangle symmetry with inner heat-conducting pipe (round) as central heat sink and (b) three power switches (here half-bridges) in triangle symmetry with inner heat-conducting pipe (triangular) as central heat sink.

For example, a B6 bridge circuit of a 3-phase motor controller can be produced in the manner according to FIG. 2. The three half-bridge assemblies, which are then structurally identical, occupy a minimal volume in the shown isosceles triangular configuration in which they face one another, and the power electronics module according to the teaching of the present invention is thus as compact as possible.

It is not difficult for a person skilled in the art to recognize that other, typically symmetrical, compact arrangements can also be constructed similarly from conventional power modules with a cooling area enlarged in accordance with the invention on account of additional central heat sinks 60, 61, 63, 64, preferably those that have a square or an N-sided polygon with N>4 as cross-section.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A power electronics module comprising a first circuit carrier, as well as a first electronic assembly arranged in an electrically contacting manner on the upper flat side of the first circuit carrier, and a first cooling element in thermal contact with the underside of the first circuit carrier, wherein the module has at least one second electronic assembly arranged on the upper side of a second circuit carrier and a second cooling element arranged on the underside of the second circuit carrier, wherein the first and the second circuit carriers are arranged with their upper sides facing one another and at least one central heat sink that is electrically insulated from the electronic assemblies is arranged in the space between the electronic assemblies, wherein the electronic assemblies and the at least one central heat sink are embedded in a heat-conducting potting compound, wherein the module has a number N≥3 of circuit carriers with electronic assemblies mounted on their upper sides and cooling elements mounted on their undersides, and the sides having the electronic assemblies and directed towards one another are arranged around the central heat sink forming a shape with an N-sided polygon as a cross-section.

2. The power electronics module as claimed in claim 1, wherein the central heat sink has a shape with an N-sided polygon as cross-section.

3. The power electronics module as claimed in claim 2, wherein the N-sided polygon of the heat sink and the N-sided polygon formed by the circuit carriers have an identical shape.

4. The power electronics module as claimed in claim 3, wherein the first circuit carrier is planar.

5. The power electronics module as claimed in claim 3, wherein the second circuit carrier is planar.

6. The power electronics module as claimed in claim 3, wherein the first cooling element is thermally contacted in a frictionally engaged and form-fitting manner with the underside of the first circuit carrier.

7. The power electronics module as claimed in claim 2, wherein the first circuit carrier is planar.

8. The power electronics module as claimed in claim 2, wherein the second circuit carrier is planar.

9. The power electronics module as claimed in claim 2, wherein the first cooling element is thermally contacted in a frictionally engaged and form-fitting manner with the underside of the first circuit carrier.

10. The power electronics module as claimed in claim 1, wherein the first circuit carrier is planar.

11. The power electronics module as claimed in claim 10, wherein the second circuit carrier is planar.

12. The power electronics module as claimed in claim 1, wherein the second circuit carrier is planar.

13. The power electronics module as claimed in claim 1, wherein the first cooling element is thermally contacted in a frictionally engaged and form-fitting manner with the underside of the first circuit carrier.

14. The power electronics module as claimed in claim 1, wherein the second cooling element is thermally contacted in a frictionally engaged and form-fitting manner with the underside of the second circuit carrier.

15. The power electronics module as claimed in claim 1, wherein the first and the second circuit carrier are arranged in a fixed manner with upper sides facing one another.

16. The power electronics module as claimed in claim 1, wherein the circuit carriers are the same size.

17. The power electronics module as claimed in claim 1, wherein the circuit carriers are arranged in a fixed manner around the central heat sink.

18. The power electronics module as claimed in claim 1, wherein the second cooling element is thermally contacted in a frictionally engaged and form-fitting manner with the underside of the second circuit carrier.

19. A power electronics module comprising a first circuit carrier, as well as a first electronic assembly arranged in an electrically contacting manner on the upper flat side of the first circuit carrier, and a first cooling element in thermal contact with the underside of the first circuit carrier, wherein the module has at least one second electronic assembly arranged on the upper side of a second circuit carrier and a second cooling element arranged on the underside of the second circuit carrier, wherein the first and the second circuit carriers are arranged with their upper sides facing one another and at least one central heat sink that is electrically insulated from the electronic assemblies is arranged in the space between the electronic assemblies, and wherein the electronic assemblies and the at least one central heat sink are embedded in a heat-conducting potting compound.

20. A power electronics module comprising a number $N \geq 3$ of circuit carriers with electronic assemblies mounted on their upper sides and cooling elements mounted on their undersides, and the sides having the electronic assemblies and directed towards one another are arranged around at least one central heat sink that is electrically insulated from the electronic assemblies is arranged in the space between the electronic assemblies, the electronic assemblies forming a shape with an N-sided polygon as a cross-section, wherein the electronic assemblies and the at least one central heat sink are embedded in a heat-conducting potting compound.

* * * * *